(12) United States Patent
Satsukawa

(10) Patent No.: US 7,218,159 B2
(45) Date of Patent: May 15, 2007

(54) FLIP-FLOP CIRCUIT HAVING MAJORITY-LOGIC CIRCUIT

(75) Inventor: Yoshihiko Satsukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/086,578

(22) Filed: Mar. 23, 2005

(65) Prior Publication Data

US 2005/0162185 A1    Jul. 28, 2005

Related U.S. Application Data

(63) Continuation of application No. PCT/JP03/06356, filed on May 21, 2003.

(51) Int. Cl.
*H00K 3/00* (2006.01)

(52) U.S. Cl. ...................... 327/199; 327/225

(58) Field of Classification Search .............. 327/199, 327/200, 201, 202, 203, 204, 205, 206, 207, 327/208, 209, 210, 211, 212
See application file for complete search history.

(56) References Cited

U.S. PATENT DOCUMENTS

| | | | | |
|---|---|---|---|---|
| 4,142,242 A | * | 2/1979 | Duvochel et al. | ........... 708/627 |
| 4,686,676 A | * | 8/1987 | McPherson | ................. 714/797 |
| 4,748,594 A | * | 5/1988 | Iida | ............................. 365/200 |
| 4,949,360 A | * | 8/1990 | Martin | ........................ 375/354 |
| 5,095,418 A | * | 3/1992 | Arita et al. | .................... 700/82 |
| 5,537,655 A | * | 7/1996 | Truong | ........................ 714/12 |
| 6,389,063 B1 | * | 5/2002 | Kanekawa et al. | ......... 375/222 |
| 6,417,710 B1 | * | 7/2002 | Bartholet | .................... 327/200 |
| 6,720,811 B2 | * | 4/2004 | Yazawa et al. | ............. 327/161 |

FOREIGN PATENT DOCUMENTS

| | | |
|---|---|---|
| JP | 55-119753 | 9/1980 |
| JP | 61-256822 | 11/1986 |
| JP | 2-78089 | 3/1990 |
| JP | 4-170792 | 6/1992 |
| JP | 2000-163320 | 6/2000 |
| JP | 2002-185309 | 6/2002 |

* cited by examiner

*Primary Examiner*—Quan Tra
*Assistant Examiner*—Khareem Almo
(74) *Attorney, Agent, or Firm*—Staas & Halsey LLP

(57) ABSTRACT

A flip-flop circuit having a majority-logic circuit is disclosed. The circuit further includes multiple master latches for writing in corresponding input signals, and one slave latch having an input connected to an output of the majority-logic circuit and an output connected to the inputs of the majority-logic circuit. The majority logic-circuit has multiple inputs connected to respective outputs of the master latches. During the period in which the master latches do not write in the corresponding input signals, an output signal of the majority-logic circuit is supplied to respective inputs of the master latches.

5 Claims, 13 Drawing Sheets

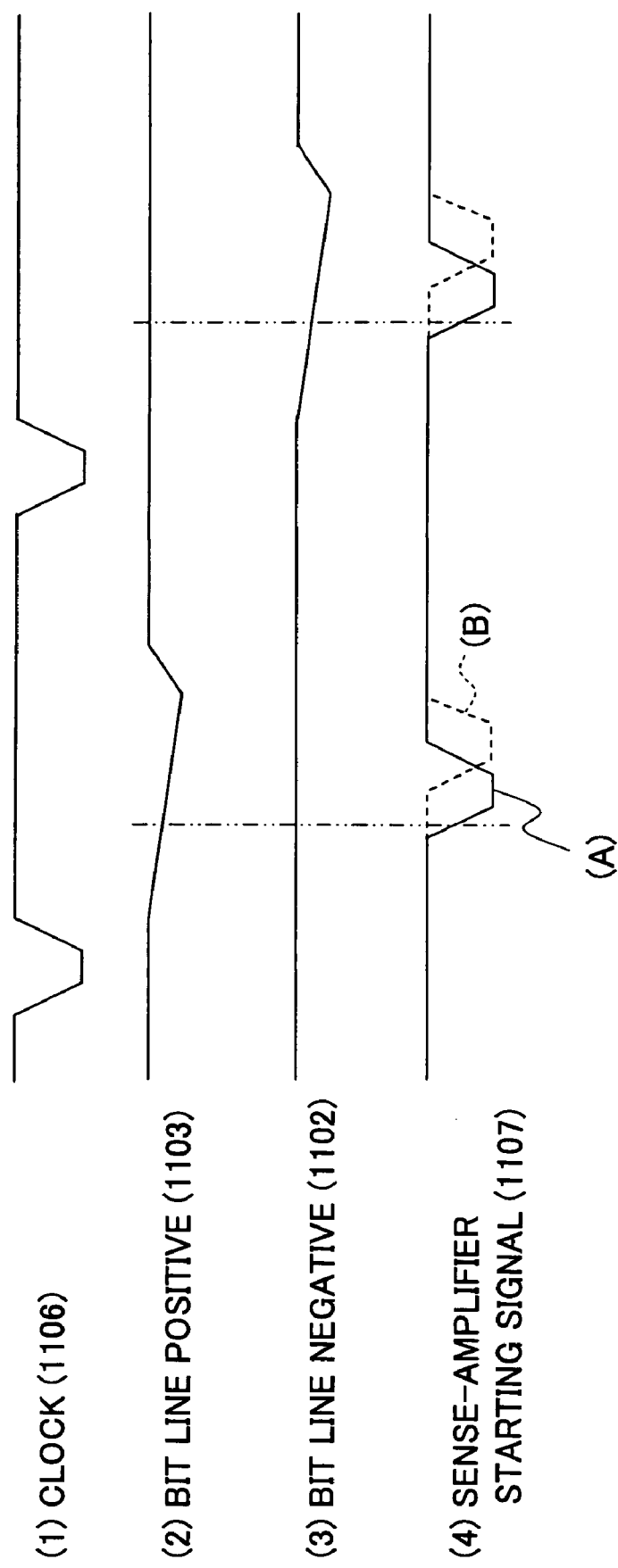

FLIP-FLOP CIRCUIT HAVING MAJORITY-LOGIC CIRCUIT

CROSS-REFERENCE TO RELATED APPLICATION

This application is a U.S. continuation application filed under 35 USC 111(a) claiming benefit under 35 USC 120 and 365(c) of PCT application JP03/06356, filed May 21, 2003, which is hereby incorporated by reference.

BACKGROUND OF THE INVENTION

1. Field of the Invention

The present invention generally relates to a technology for a flip-flop circuit, and particularly relates to a flip-flop circuit having a majority-logic circuit for making it possible, even when a soft error takes place, to output correct storage contents and to recover from the soft error so as to maintain the correct storage contents.

2. Description of the Related Art

There is a phenomenon, known as a soft error, such that data maintained in a memory circuit, etc., are corrupted. The soft error is a phenomenon such that alpha rays generated from LSI-chip materials as well as secondary cosmic-ray neutrons causing electric charges to be generated within an electronic circuit influence one-bit data maintained in the memory circuit, or a flip-flop circuit within a logic-circuit section, to be reverted so as to corrupt the maintained data. When such soft error takes place, the memory circuit or the flip-flop circuit within the logic-circuit section malfunctioning does not mean, from the hardware point of view, that any failures have taken place in the malfunctioned memory circuit or the flip-flop circuit as described above. Therefore, if new data were written into the malfunctioned memory circuit or the flip-flop circuit as described above, the circuit should work as designed.

The soft error, typically taking place with a low probability as an isolated event, manifests itself as a fault with an even lower probability.

For example, an error-correction circuit is typically mounted in the memory circuit. Then, there is no influence of the one-bit error as described above at the output of the memory circuit as the one-bit error should be corrected by means of the error-correction circuit as described above.

Moreover, in the flip-flop circuit arranged within the logic-circuit section, writing is performed at a clock cycle immediately following the current clock cycle so that the corrupted data are maintained only for a short period, and the corrupted data are masked by other logic-circuit states so that the probability of the corrupted data not influencing the processing of other circuit sections is high.

On the other hand, as for some data such as parameter values of a timing-adjusting circuit, there is a high likelihood that an occurrence of the soft error as described above triggers malfunctioning across the whole chip. More specifically, data set during the period of an initializing operation of a system, etc., are not rewritten after the initializing is terminated for starting an actual operation, so that the corrupted data continue to be maintained, often resulting in a malfunction.

At the present, when the soft error as described above takes place, as for the flip-flop circuit for storing a signal which greatly influences the overall system, for example, triplicating a flip-flop to implement a three-input majority-logic circuit provides for reducing the probability of causing a fault to the system even when the soft error takes place.

FIG. 1 illustrates a conventional flip-flop circuit. In the flip-flop circuit as illustrated in FIG. 1, a flip-flop is triplicated to implement the three-input majority-logic circuit as described above. The flip-flop circuit as described above is primarily composed of a flip-flop 110, a flip-flop 120, a flip-flop 130, and a majority-logic circuit 140. The flip-flop 110 is composed of inverters 111 and 114, each with an enable terminal, and inverters 112, 113, 115, and 116. Input data 101 are supplied to the input of the inverter 111 with the enable terminal, while a clock signal (CK) 102 is supplied to the enable terminal of the inverter 111. The output of the inverter 111 is connected to the input of the inverter 112. The output of the inverter 112 is connected to the input of the inverter 113 and the input of the inverter 114. The output of the inverter 113 is connected to the input of the inverter 112. A clock signal (CKB) 103 is supplied to the enable terminal of the inverter 114. The output of the inverter 114 is connected to the input of the inverter 115. The output of the inverter 115 is connected to the input of the inverter 116, and one input of a two-input NAND circuit 141 and one input of a two-input NAND circuit 142 that are within the majority-logic circuit 140. The output of the inverter 116 is connected to the input of the inverter 115.

The majority-logic circuit 140 is composed of two-input NAND circuits 141 and 142 and 143, and a three-input NAND circuit 144. The outputs of the two-input NAND circuits 141, 142, and 143 are connected to the input of the three-input NAND circuit 144.

The flip-flop 120 in FIG. 1 is composed of inverters 121 through 126, while the flip-flop 130 is composed of inverters 131 through 136. The flip-flops 120 and 130 have the same configuration as the flip-flop 110. The output of the flip-flop 120 is connected to one input of the two-input NAND circuit 141 and one input of the two-input NAND circuit 143 that are within the majority-logic circuit 140, while the output of the flip-flop 130 is connected to one input of the two-input NAND circuit 142 and the one input of the two-input NAND circuit 143 that are within the majority-logic circuit 140.

The input data are supplied to the flip-flop 110 so that the supplied data are written into a master latch composed of the feedback inverters 112 and 113 when the clock signal 102 (CK) is at a low level and into a slave latch composed of the feedback inverters 115 and 116 when the clock signal 103 (CKB) is at a low level. For instance, the clock signal 102 (CK) and the clock signal 103 (CKB) may have their phases inverted from each other.

The flip-flops 120 and 130 are supplied the same input data 101 as the flip-flop 110 so as to perform the same operation.

The majority-logic circuit 140 outputs a logic level "1" as output data 104 when the logic level of at least two of the outputs of the flip-flops 110, 120 and 130 are "1". On the other hand, the majority-logic circuit 140 outputs a logic level "0" as the output data 104 when the logic level of at least two of the outputs of the flip-flops 110, 120 and 130 are "0".

However, a problem exists such that, for using the conventional flip-flop circuit as illustrated in FIG. 1, the size of the flip-flop circuit 100 is large. In addition, a problem exists such that, with a large number of flip-flops making up the flip-flop circuit 100, it takes a long time to test the flip-flop circuit 100 when implementing the flip-flop circuit 100 on a LSI circuit. Moreover, a problem exists such that, when the soft error takes place multiple times, the output of the conventional flip-flop circuit 100 as illustrated in FIG. 1 not having any functions of recovering from the soft error taking place becomes erroneous so as to cause a fault in the system in which the flip-flop circuit 100 is used.

Furthermore, the technology related to the present invention is also described in Patent Documents 1, 2, and 3:
Patent Document 1
JPO4-170792A
Patent Document 2
JP2002-185309A
Patent Document 3
JP61-256822A

SUMMARY OF THE INVENTION

It is a general object of the present invention to provide a technology for a digital circuit that substantially obviates one or more problems caused by the limitations and disadvantages of the related art.

It is a more particular object of the present invention to provide a flip-flop circuit having a majority-logic circuit for making it possible, even when a soft error takes place, to output correct storage contents and to recover from the soft error so as to maintain the correct storage contents.

According to the invention, a flip-flop circuit having a majority-logic circuit includes multiple master latches for writing in corresponding input signals, and one slave latch having an input connected to an output of the majority-logic circuit and an output connected to the inputs of the majority-logic circuit, wherein the majority-logic circuit has multiple inputs connected to respective outputs of the master latches, and wherein, during the period in which the master latches do not write in the corresponding input signals, an output signal of the majority-logic circuit is supplied to respective inputs of the master latches.

The majority-logic circuit makes it possible, even when a soft error takes place, to output correct storage contents and to recover from the soft error so as to maintain the correct storage contents.

Other objects and further features of the present invention will be apparent from the following detailed description when read in conjunction with the accompanying drawings.

BRIEF DESCRIPTION OF THE DRAWINGS

FIG. 13 is a diagram illustrating an example of a timing adjustment of a sense-amplifier starting signal.

DETAILED DESCRIPTION OF THE PREFERRED EMBODIMENTS

In the following, embodiments of the present invention are described with reference to the accompanying drawings.

Figure 2:
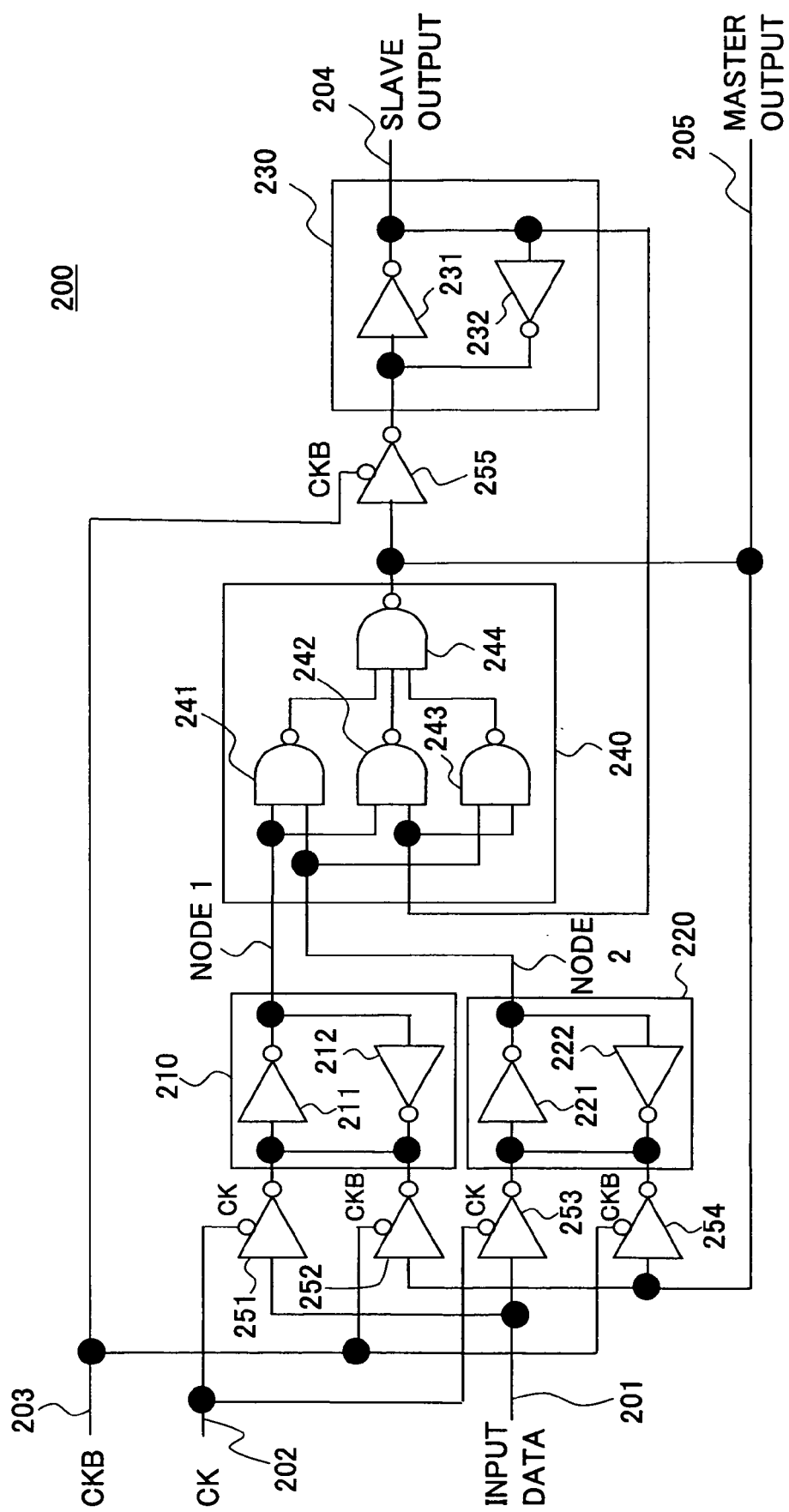
FIG. 2 is a diagram illustrating a flip-flop circuit of a first embodiment of the present invention.

First, a flip-flop circuit of a first embodiment of the present invention is described. FIG. 2 illustrates a flip-flop circuit 200 of the first embodiment of the present invention.

The flip-flop circuit 200 of FIG. 2 is primarily composed from a first master latch 210, a second master latch 220, a slave latch 230, a majority-logic circuit 240, and inverters 251, 252, 253, 254 and 255, each with an enable terminal. The inverters 251 and 252 work as an input-switching circuit of the first master latch 210, while the inverters 253 and 254 act as an input-switching circuit of the second master latch 220.

The first master latch 210 is composed of inverters 211 and 212. The output of the inverter 211 connected to the input of the inverter 212 and the output of the inverter 212 connected to the input of the inverter 211 form a feedback circuit. The output of the inverter 211 is called a node 1. The second master latch 220 is composed of inverters 221 and 222. The output of the inverter 221 connected to the input of the inverter 222 and the output of the inverter 222 connected to the input of the inverter 221 form a feedback circuit. The output of the inverter 221 is called a node 2. The slave latch 230 is composed of inverters 231 and 232. The output of the inverter 231 connected to the input of the inverter 232 and the output of the inverter 232 connected to the input of the inverter 231 form a feedback circuit. The majority-logic circuit 240 is composed of two-input NAND circuits 241, 242 and 243, and a three-input NAND circuit 244. The outputs of the two-input NAND circuits 241, 242 and 243 are connected to inputs of the three-input NAND circuit 244.

Input data 201 are supplied to the input of the inverter 251 with the enable terminal, while a clock signal (CK) 202 is supplied to the enable terminal of the inverter 251. The output of the inverter 251 is connected to the input of the inverter 211 that is the input of the first master latch 210. The input data 201 supplied to the inverter 251 are written into the first master latch 210 when the clock signal 202 (CK) is at a low level.

Similarly, the input data 201 are also supplied to the input of the inverter 253 with the enable terminal, while the clock signal (CK) 202 is supplied to the enable terminal of the inverter 253. The output of the inverter 253 is connected to the input of the inverter 221 that is the input of the second master latch 220. The input data 201 supplied to the inverter 253 are written into the second master latch 220 when the clock signal 202 (CK) is at a low level.

When the clock signal 203 (CKB) is at a high level, the slave latch 230 maintains its storage contents.

The output of the first master latch 210 is input to the two-input NAND circuits 241 and 242 of the majority-logic circuit 240, the output of the second master latch 220 is input to the two-input NAND circuits 241 and 243 of the majority-logic circuit 240, and the output of the slave latch 230 is input to the two-input NAND circuits 242 and 243 of the majority-logic circuit 240. Then the majority-logic circuit 240 performs a majority operation on the output of the first master latch 210, the output of the second master latch 220 and the output of the slave latch 230 so that the result of the majority operation is output from the output of the three-input NAND circuit 244.

Then, the clock signal (CKB) 203 turns to a low level so that, during this period, the output of the majority-logic circuit 240 is transferred via the inverter 255 to the slave latch 230 and then a slave output 204 which is the output of the flip-flop circuit 200 is output from the output of the slave latch 230. Moreover, a master output 205 is output from the output of the majority-logic circuit 240.

Thus, the majority-logic circuit 240 performs the majority operation on the output of the first master latch 210, the output of the second master latch 220 and the output of the slave latch 230 so as to make it possible to output correct storage contents even when a soft error takes place in one of the latches as described above.

Moreover, when the clock signal (CKB) 203 is at a low level, the inverters 251 and 253 are cut-off, while the inverters 252 and 254 write the master output 205 which is the output of the majority-logic circuit 240 in the first master latch 210 and second master latch 220, respectively.

Hereby, even when a soft error takes place in one of the latches as described above, correct data are stored again in the latch in which the soft error has taken place so as to make it possible to recover from the soft error for maintaining correct storage contents.

Figure 3:
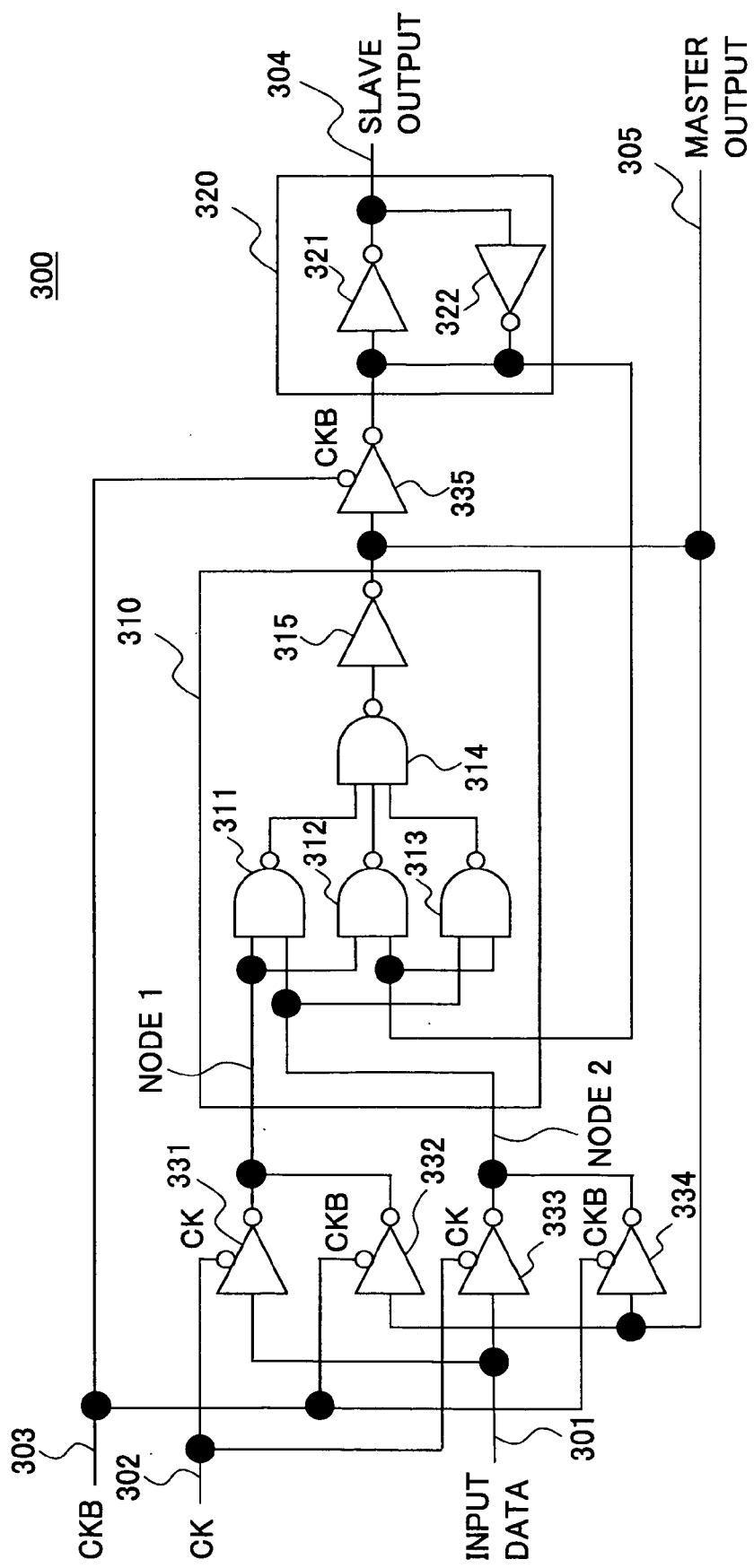
FIG. 3 is a diagram illustrating a flip-flop circuit of a second embodiment of the present invention.

Next, a second embodiment of the present invention is described. FIG. 3 illustrates a flip-flop circuit 300 of the second embodiment of the present invention.

The flip-flop circuit 300 of FIG. 3 is composed primarily from a slave latch 320, a majority-logic circuit 310, and inverters 331, 332, 333, 334, and 335, each with an enable terminal. The inverters 331 and 332 act as a first input-switching circuit, while the inverters 333 and 334 act as a second input-switching circuit.

The slave latch 320 is composed of inverters 321 and 322. The output of the inverter 321 connected to the input of the inverter 322 and the output of the inverter 322 connected to the input of the inverter 321 form a feedback circuit. The majority-logic circuit 310 is composed of two-input NAND circuits 311, 312 and 313, a three-input NAND circuit 314, and an inverter 315. The outputs of the two-input NAND circuits 311, 312 and 313 are connected to inputs of the three-input NAND circuit 314, while the output of the three-input NAND circuit 314 is connected to the input of the inverter 315.

Figure 4:
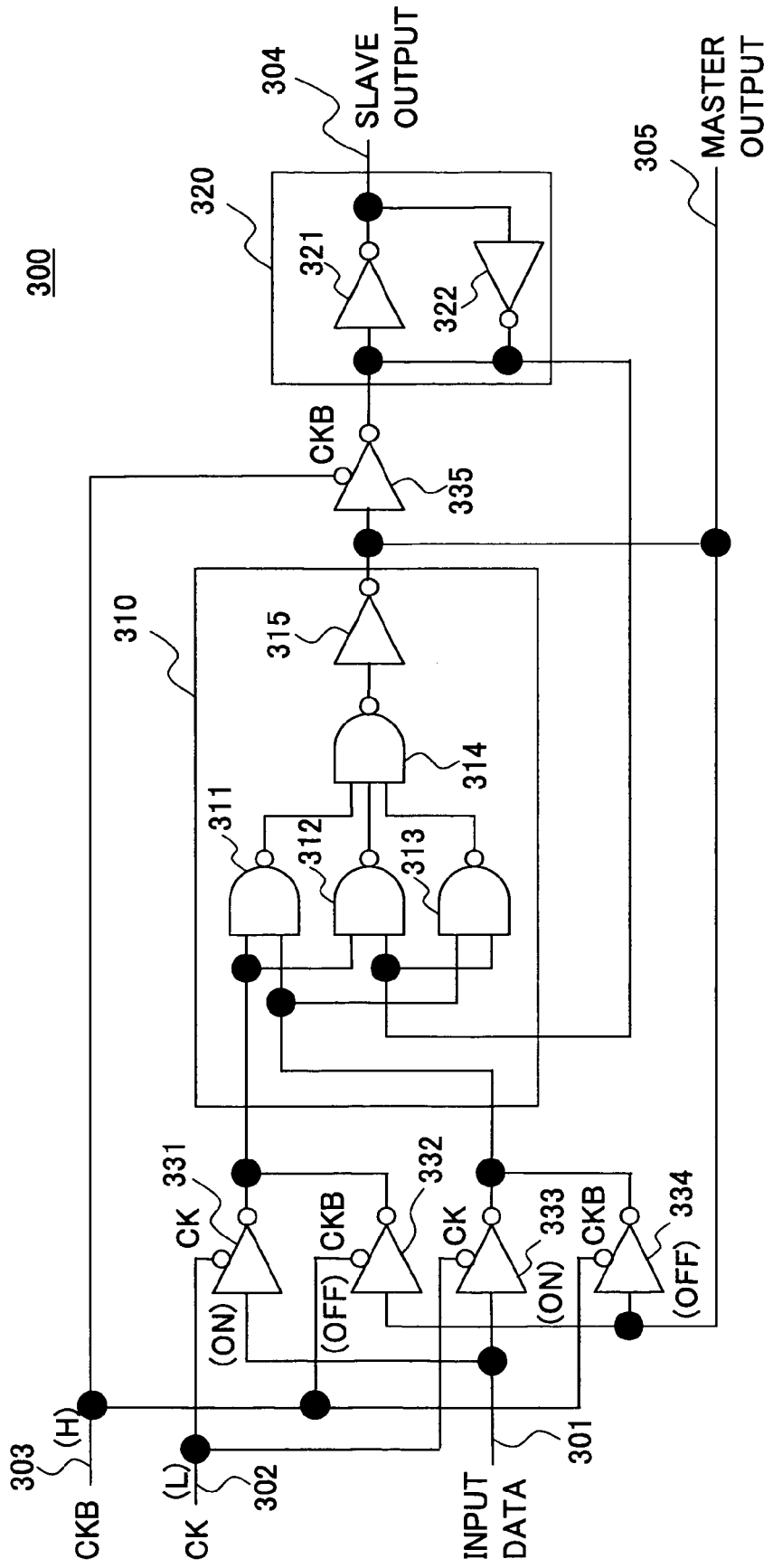
FIG. 4 is a diagram illustrating a state such that, in the flip-flop circuit of the second embodiment of the present invention, a clock signal CK is at a low level, while a clock signal CKB is at a high level.

FIG. 4 is a diagram illustrating a state such that a clock signal (CK) 302 is at a low level while a clock signal (CKB) 303 is at a high level.

Input data 301 are supplied to the input of the inverter 331 with the enable terminal, while the clock signal (CK) 302 is supplied to the enable terminal of the inverter 331. The output of the inverter 331 is connected to the inputs of the two-input NAND circuits 311 and 312 of the majority-logic circuit 310. The output of the inverter 331 is called a node 1. The input data 301 supplied to the inverter 331 are input to the two-input NAND circuits 311 and 312 of the majority-logic circuit 310 when the clock signal 302 (CK) is at a low level.

Similarly, the input data 301 are supplied to the input of the inverter 333 with the enable terminal, while the clock signal (CK) 302 is supplied to the enable terminal of the inverter 333. The output of the inverter 333 is connected to the two-input NAND circuits 311 and 313 of the majority-logic circuit 310. The output of the inverter 333 is called a node 2. The input data 301 supplied to the inverter 333 are input to the two-input NAND circuits 311 and 313 of the majority-logic circuit 310 when the clock signal 302 (CK) is at a low level.

When the clock signal 303 (CKB) is at a high level, the slave latch 320 maintains its storage contents. The output of the slave latch 320 is input to the two-input NAND circuits 312 and 313 of the majority-logic circuit 310.

The majority-logic circuit 310 performs a majority operation on the output of the inverter 331, the output of the inverter 333, and the output of the slave latch 320 so that the result of the majority operation is output to the input of the inverter 315 of the majority-logic circuit 310.

Figure 5:
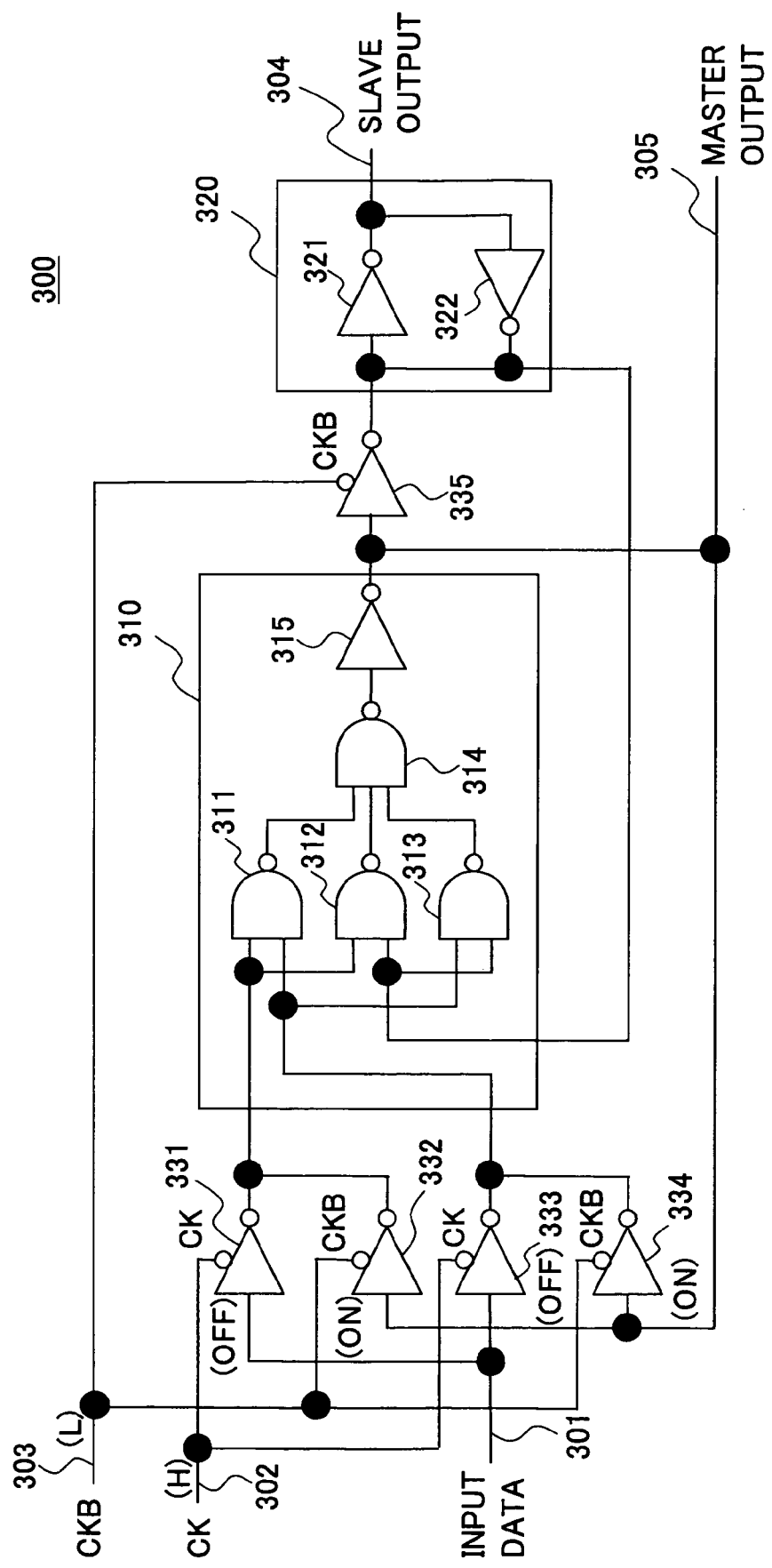
FIG. 5 is a diagram illustrating a state such that, in the flip-flop circuit of the second embodiment of the present invention, the clock signal CKB is at a low level, while the clock signal CK is at a high level.

FIG. 5 is a diagram illustrating a state in which the clock signal (CKB) 303 is at a low level, while the clock signal (CK) 302 is at a high level.

Then, the clock signal (CKB) 303 turns to a low level so that, during this period, the output of the majority-logic circuit 310 is transferred via the inverter 335 to the slave latch 320 and then a slave output 304 which is the output of the flip-flop circuit 300 is output from the output of the slave latch 320. Moreover, a master output 305 is output from the output of the majority-logic circuit 310.

Thus, the majority-logic circuit 310 performs the majority operation on the output of the inverter 331, the output of the inverter 333, and the output of the slave latch 310 so as to make it possible to output correct storage contents even when a soft error takes place in the slave latch 320.

Moreover, when the clock signal (CKB) 303 is at a low level, the inverters 331 and 333 are cut-off while each of the inverters 332 and 334 input the master output 305 which is the output of the majority-logic circuit 310 to the majority-logic circuit 310. Thus, the inverters 331 and 332 and the majority-logic circuit 310 implement the same operation as the operation of the first master latch of the first embodiment as described above so as to correspond to the first master latch, while the inverters 333 and 334 and the majority-logic circuit 310 implement the same operation as the operation of the second master latch of the first embodiment as described above so as to correspond to the second master latch.

Hereby, even when a soft error takes place in one of the inverters 332, 334 and the slave latch 320, correct data are stored again in the one of the inverters 332 and 334 and the slave latch 320 as described above so as to make it possible to recover from the soft error for maintaining correct storage contents.

Figure 1:
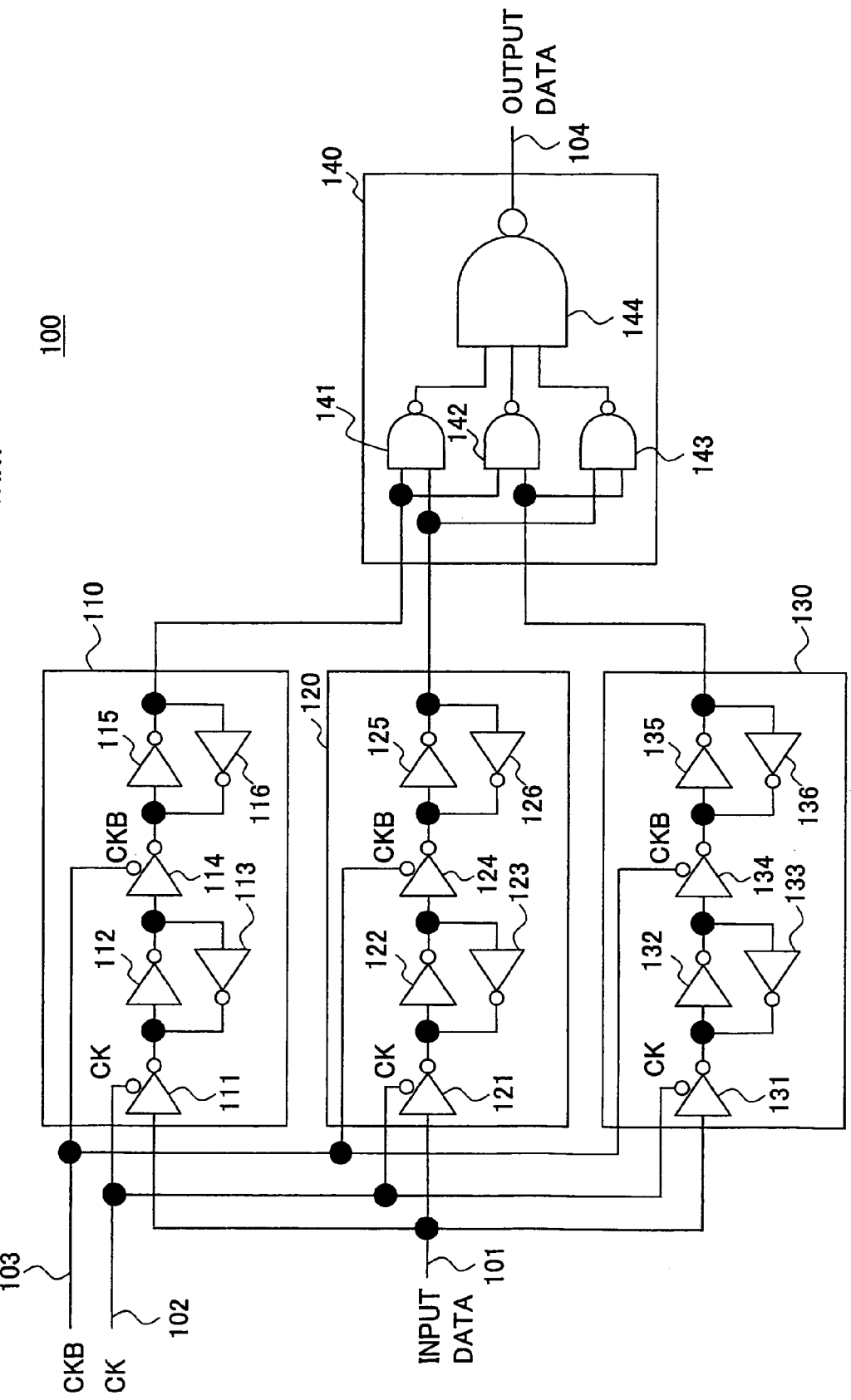
FIG. 1 is a diagram illustrating a conventional flip-flop circuit.

Moreover, two additional master latches can be removed from the first embodiment according to the present embodiment so as to make it possible to provide a flip-flop circuit with the circuit size reduced further from the related art as illustrated in FIG. 1. A feedback transistor has an irregular circuit layout and a coverage area within a LSI chip that is larger than a typical transistor, so that there is a great advantage in reducing the area.

Next, a comparison between the operation of the flip-flop circuit 200 of the first embodiment or the flip-flop circuit 300 of the second embodiment of the present invention and the operation of a conventional one flip-flop is described. FIG.

6 is a diagram illustrating the comparison of the operation of the flip-flop circuit of the first embodiment or the second embodiment of the present invention and the operation of, for example, the conventional one flip-flop such as the flip-flop 110 in FIG. 1 when a soft error does not take place.

Item (1) illustrates a clock signal (CK). A clock signal (CKB) is a signal having inverted the clock signal (CK). A period α represents the period during which the nodes 1 and 2 in FIGS. 2 and 3 are driven from the input. This state corresponds to the state as illustrated in FIG. 4 for the second embodiment. On the other hand, a period β represents the period during which data are transferred to the slave latches 230 and 320 in FIGS. 2 and 3. This state corresponds to the state as illustrated in FIG. 5 for the second embodiment;

Item (2) illustrates the state of the node 1 in FIGS. 2 and 3;

Item (3) illustrates the state of the node 2 in FIGS. 2 and 3;

Item (4) illustrates the output of the slave latches 230 and 320 in FIGS. 2 and 3;

Item (5) illustrates the output of the majority-logic circuit 240 and 310 in FIGS. 2 and 3;

Item (6) illustrates the output of a master latch of the conventional one flip-flop such as the flip-flop 110 in FIG. 1, for example; and Item (7) illustrates the output of a slave latch of the conventional one flip-flop such as the flip-flop 110 in FIG. 1, for example.

When shifting from the period β to the period α, as illustrated in (2) and (3), data of the first and second master latches in FIG. 2 and data which the inverters 331 and 333 in FIG. 3 output are rewritten with input data. Hereby, the nodes 1 and 2 are rewritten. Then, data of the nodes 1 and 2 are input to the majority-logic circuit. However, as the nodes 1 and 2 in FIGS. 2 and 3 are both rewritten with the same data, as illustrated in (5) as described above, the output of the majority-logic circuit is also maintained at a correct value representing input data so as to output the maintained value.

When shifting from the period α to the period β, as illustrated in (4), the value which the majority-logic circuit outputs is transferred to the slave latch for rewriting into the slave latch with the transferred value. Then, at the same time, the nodes 1 and 2 are rewritten with the value that the majority-logic circuit outputs, which value is the same as the input data.

On the other hand, the output of the master latch of the conventional one flip-flop as illustrated in (6) corresponds to (2) and (3) as described above, while the output of the slave latch of the conventional one flip-flop as illustrated in (7) corresponds to (4) as described above.

Thus, when a soft error does not take place, the nodes 1 and 2 and the slave latch in FIGS. 2 and 3 perform the same operation as the conventional one flip-flop.

In a similar manner to the conventional flip-flop circuit, as writing from the majority-logic circuit to the slave latch is always being performed during the period β, an inversion of the maintained value of the slave latch by a soft error can be recovered from immediately.

Figure 6:
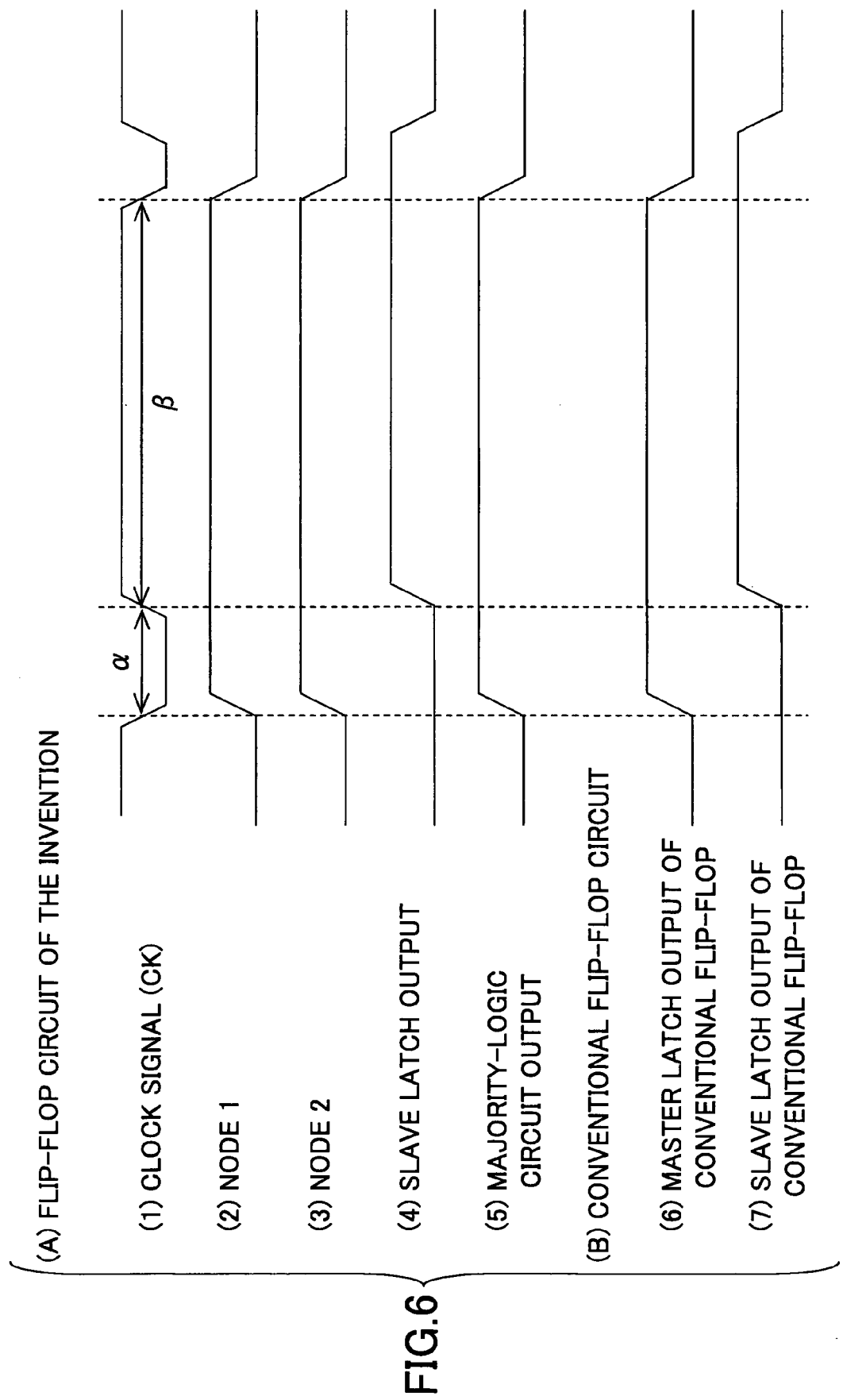
FIG. 6 is a diagram illustrating a comparison between the operation of a flip-flop circuit of embodiments of the present invention and of one conventional flip-flop when a soft error does not take place.
Figure 7:
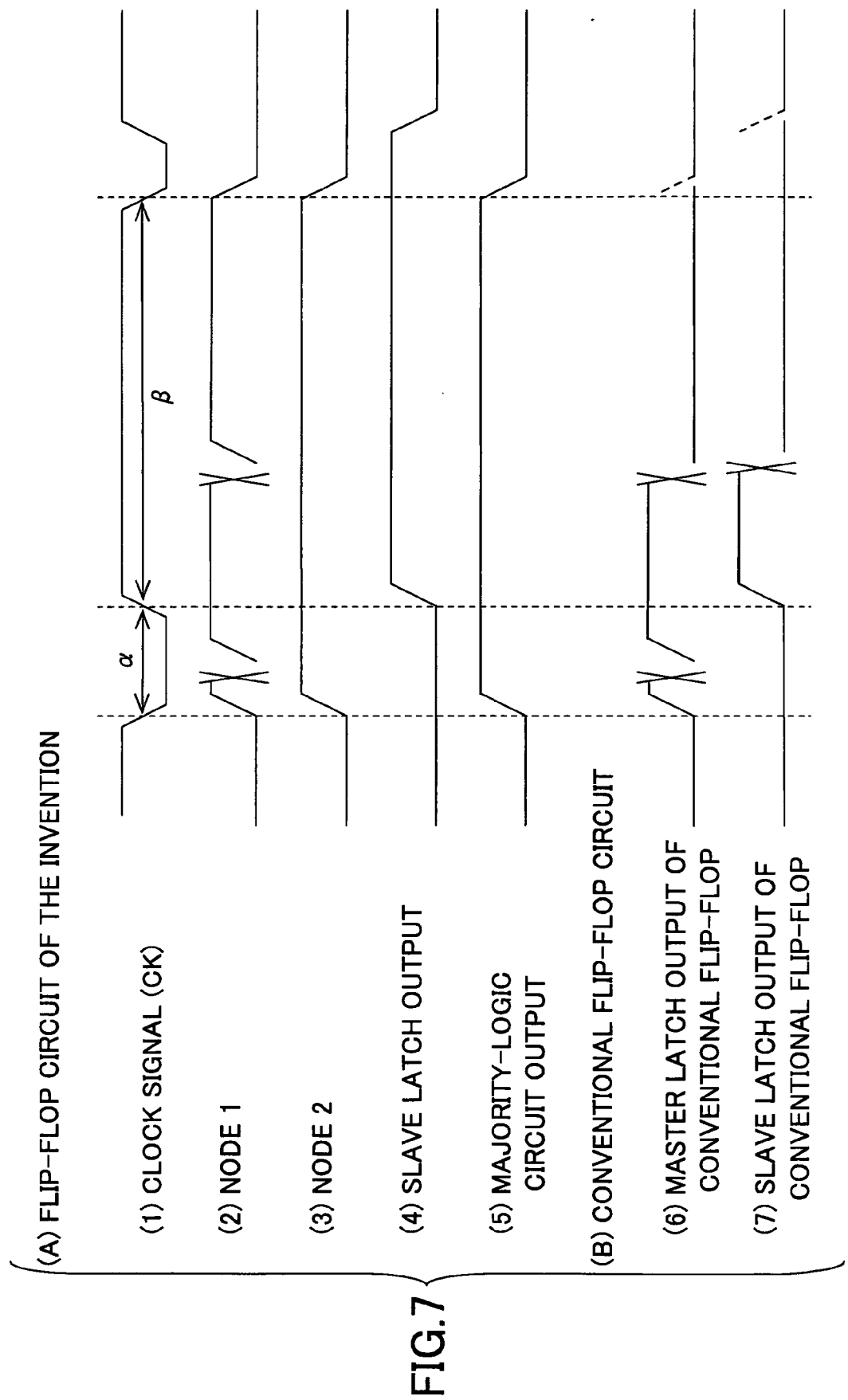
FIG. 7 is a diagram illustrating a comparison of the operation of the flip-flop circuit of the embodiments of the present invention and of the one conventional flip-flop when a soft error takes place at a master latch.

FIG. 7 is a diagram illustrating a comparison of the operation of the flip-flop circuit of the present invention and the operation of the conventional one flip-flop when a soft error takes place at a master latch. Items (1) through (7) represent the same signals as in FIG. 6.

As illustrated in (2), when a soft error takes place in the master latches in FIGS. 2 and 3 and an error takes place in the node 1 during the period α, as the nodes 1 and 2 are driven by the data input, data in the node 1 immediately return to a correct value. In a flip-flop circuit according to the first and second embodiments of the present invention, when a value maintained in the master latch 1 is inverted due to a soft error during the period β, as the node 2 and the slave latch maintain the same value, the output value of the majority-logic circuit does not invert so that the maintained value of the node 1 is immediately recovered to a correct value. Similarly, when the node 2 is inverted with a soft error, there is no change to the output from the flip-flop circuit so that the value of the node 2 immediately recovers to a correct value from the inverted value.

On the other hand, in the conventional flip-flop such as the flip-flop 110 in FIG. 1, when the maintained value of the master latch is inverted during the period β, as there is no mechanism to return to a correct value, the inverted value as described above is left inverted. Hereby, an erroneous signal is immediately transmitted to the slave latch.

Figure 8:
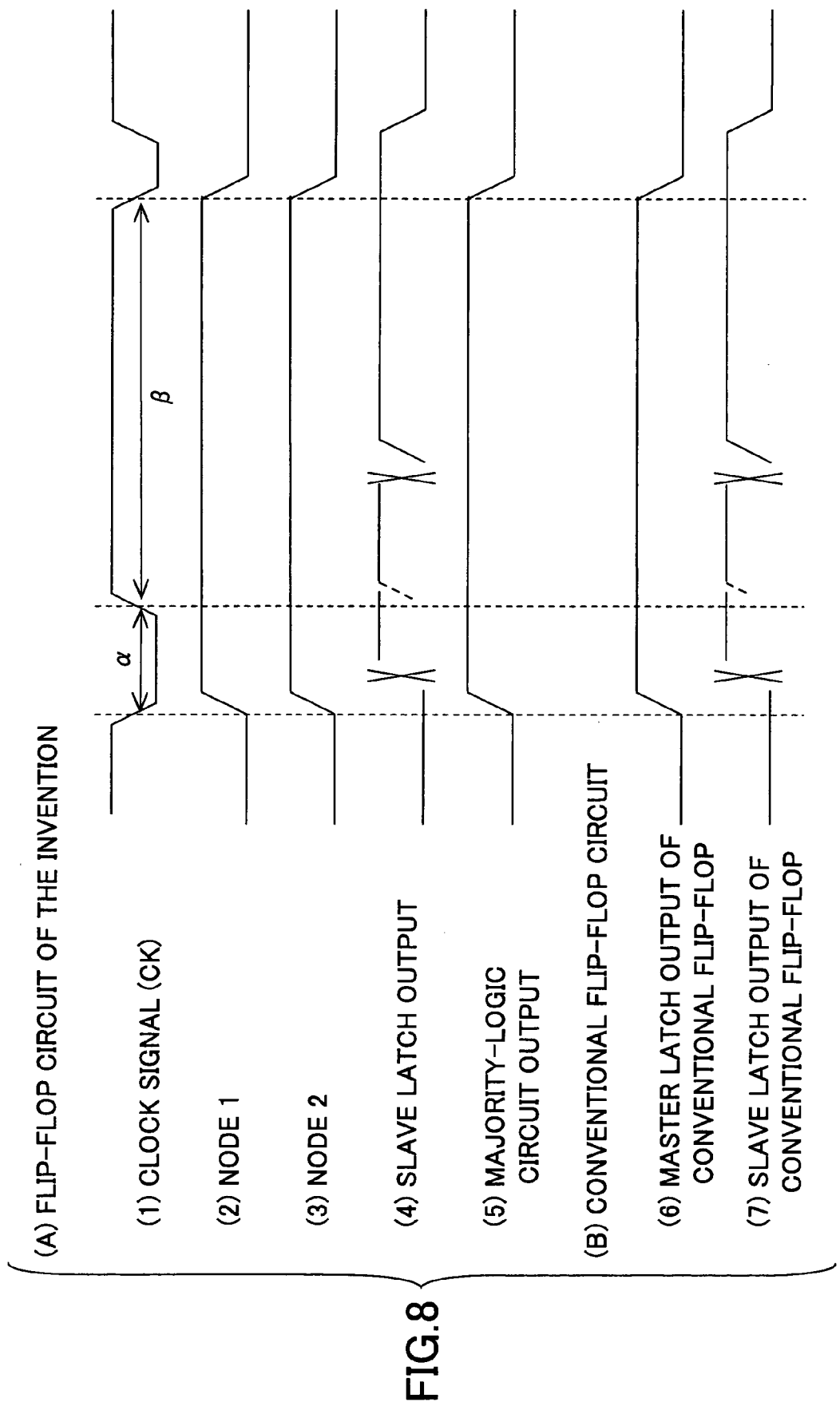
FIG. 8 is a diagram illustrating a comparison of the operation of the flip-flop circuit of the embodiments of the present invention and of the one conventional flip-flop when a soft error takes place at a slave latch.

FIG. 8 is a diagram illustrating a comparison of the operation of the flip-flop circuit of the present invention and the operation of the conventional one flip-flop. Items (1) through (7) represents the same signals as in FIG. 6.

As illustrated in (4), when a soft error takes place in the slave latch during the period α, it is not possible for any of the circuits of the first and second embodiments of the present invention and the conventional one flip-flop circuit to have data recovered to correct data. Then, when shifting to the period β, a correct value is transferred from the master latch to the slave latch. In the period β, the slave latch is driven by the master latch so that data are immediately corrected to a correct value when a soft error takes place at the slave latch.

Figure 9:
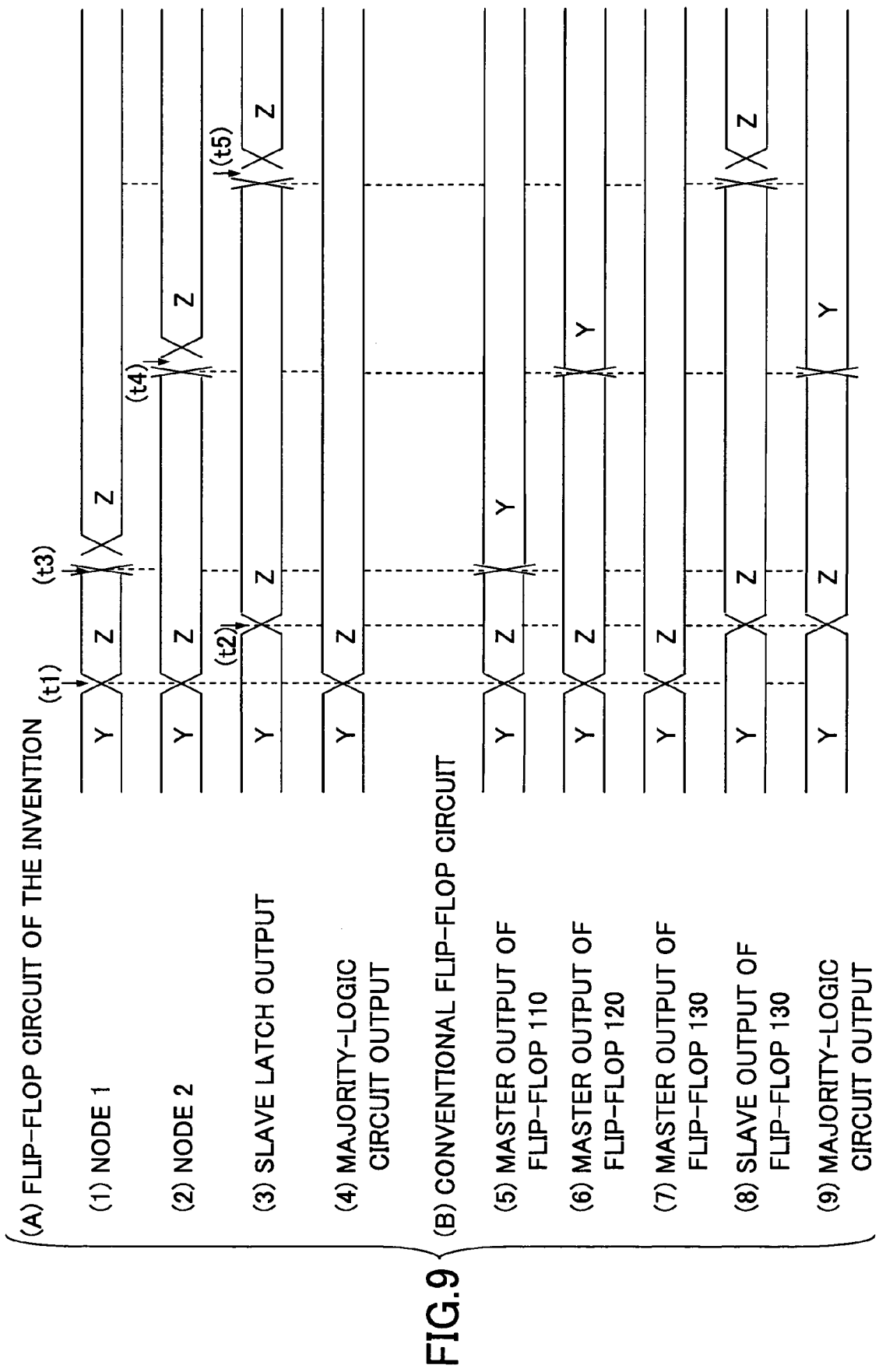
FIG. 9 is a diagram illustrating a comparison of the operation of the flip-flop circuit of the embodiments of the present invention and of a conventional flip-flop having a majority-logic circuit.

FIG. 9 is a diagram illustrating a comparison of the operation of the flip-flop circuit of the embodiments of the present invention and the operation of a conventional flip-flop having a majority-logic circuit.

Item (1) illustrates a signal of the node 1 of the flip-flop circuit of the embodiments of the present invention in FIGS. 2 and 3.

Item (2) illustrates a signal of the node 2 of the flip-flop circuit of the embodiments of the present invention in FIGS. 2 and 3.

Item (3) illustrates the output of the slave latch of the flip-flop circuit of the embodiments of the present invention in FIGS. 2 and 3.

Item (4) illustrates the output of the majority-logic circuit of the embodiments of the present invention in FIGS. 2 and 3.

Item (5) illustrates the output of a master latch of the flip-flop 110 of the conventional one flip-flop circuit in FIG. 1.

Item (6) illustrates the output of a master latch of the flip-flop 120 of the conventional flip-flop circuit in FIG. 1.

Item (7) illustrates the output of a master latch of the flip-flop 130 of the conventional flip-flop circuit in FIG. 1.

Item (8) illustrates the output of a slave latch of the flip-flop 130 of the conventional flip-flop circuit in FIG. 1.

Item (9) illustrates the output of a majority-logic circuit of the conventional flip-flop circuit in FIG. 1.

In FIG. 9, it is assumed that, at a timing (t1), initializing of the flip-flop circuit is completed and, at a timing (t2), the output of the master latch is transferred to the slave latch. Moreover, it is assumed that, at each of the timings (t3) and (t4), an error takes place at one of the master latches, and, at a timing (t5), an error takes place at the slave latch.

First, the operation of the flip-flop of the embodiments of the present invention is described using (1) through (4) in FIG. 9.

It is assumed that the signal value before initializing of the nodes 1 and 2 of the flip-flops in FIGS. 2 and 3 is "Y", "Z" is written with the initializing, and this value "Z" is maintained until the power is turned off. It is assumed that, at the timing (t1), the initializing is completed and, at the timing (t3), an error takes place at the output node 1 of the first master latch. However, an error does not take place at the output of the slave latch. Then, as the values of the node 2 and the slave latch are both "Z", the majority-logic circuit operates so that the output of the first master latch recovers to the original "Z" value.

Even when an error takes place at the output node 2 of the second master latch at the timing (t4), the operation is the same as in a case of the error taking place at the node 1 as described above.

When an error takes place at the slave latch at the timing (t5), although the output of the slave latch is inverted at one time, the value of the nodes 1 and 2 is correct so that the majority-logic circuit outputs a correct value, the correct value is transferred to the slave latch, and the output of the slave latch recovers to a correct value.

It is noted that, in the circuit of the present embodiments, when taking into account such state as described above, the master output has a reliability higher than the slave output in which a fault may take place.

Next, the operation of the conventional flip-flop in FIG. 1 is described using (5) through (9) in FIG. 9.

It is assumed that the signal value before initializing of the flip-flops 110, 120 and 130 of the conventional flip-flop in FIG. 1 is "Y", "Z" is written with the initializing, and this value "Z" is maintained until the power is turned off. When, at the timing (t1), the initializing is completed and, at the timing (t3), an error takes place at the output of the master latch of the flip-flop 110 so that the output becomes "Y", an error takes place at the output of the slave latch of the flip-flop 110 so that the output becomes "Y". Then, the master latch of the flip-flop 110 continues to maintain "Y". However, as the outputs of flip-flops 120 and 130 maintain the correct value, an error does not take place at the output (9) of the majority-logic circuit.

Then, at the timing (t4), when an error takes place at the output of the master latch of the flip-flop 120 so that the output becomes "Y", an error takes place at the output of the slave latch of the flip-flop 120 so that the output becomes "Y". Then, the master latch of the flip-flop 120 continues to maintain "Y".

As a result, since the outputs of the flip-flops 110 and 120 do not maintain correct values, an error takes place at the output (9) of the majority-logic circuit.

Since the errors of the flip-flops 110 and 120 are not recovered from, the error of the output of this conventional majority-logic circuit is not recovered from as in the embodiments of the present invention.

On the other hand, when an error takes place at the slave latch of the flip-flop 130 at the timing (t5), although the output of the slave latch is inverted once, the master latch of the flip-flop 130 maintains a correct value so that this correct value is transferred to the slave latch, and the output of the slave latch recovers to a correct value.

As described above, in the embodiments of the present invention, it is possible, even when a soft error takes place, to output correct storage contents and to recover from the soft error so as to maintain the correct storage contents.

As described previously, the circuit of the embodiments of the present invention, even when a soft error takes place, can operate correctly and maintain a correct value, and, having the same other functions as a normal flip-flop circuit, may replace the normal flip-flop circuit except in a timing-critical path such that a high-speed operation is required. More specifically, the circuit is suitable for storing a signal which causes fatal damage to the system in response to a soft error or a signal set at a time of initializing that cannot be rewritten with a system operation. Such case as described above may be, for example, maintaining a parameter value of a timing-adjusting circuit or maintaining a redundant-fuse signal value.

Next, an embodiment in such a case as described above is described.

Figure 10:
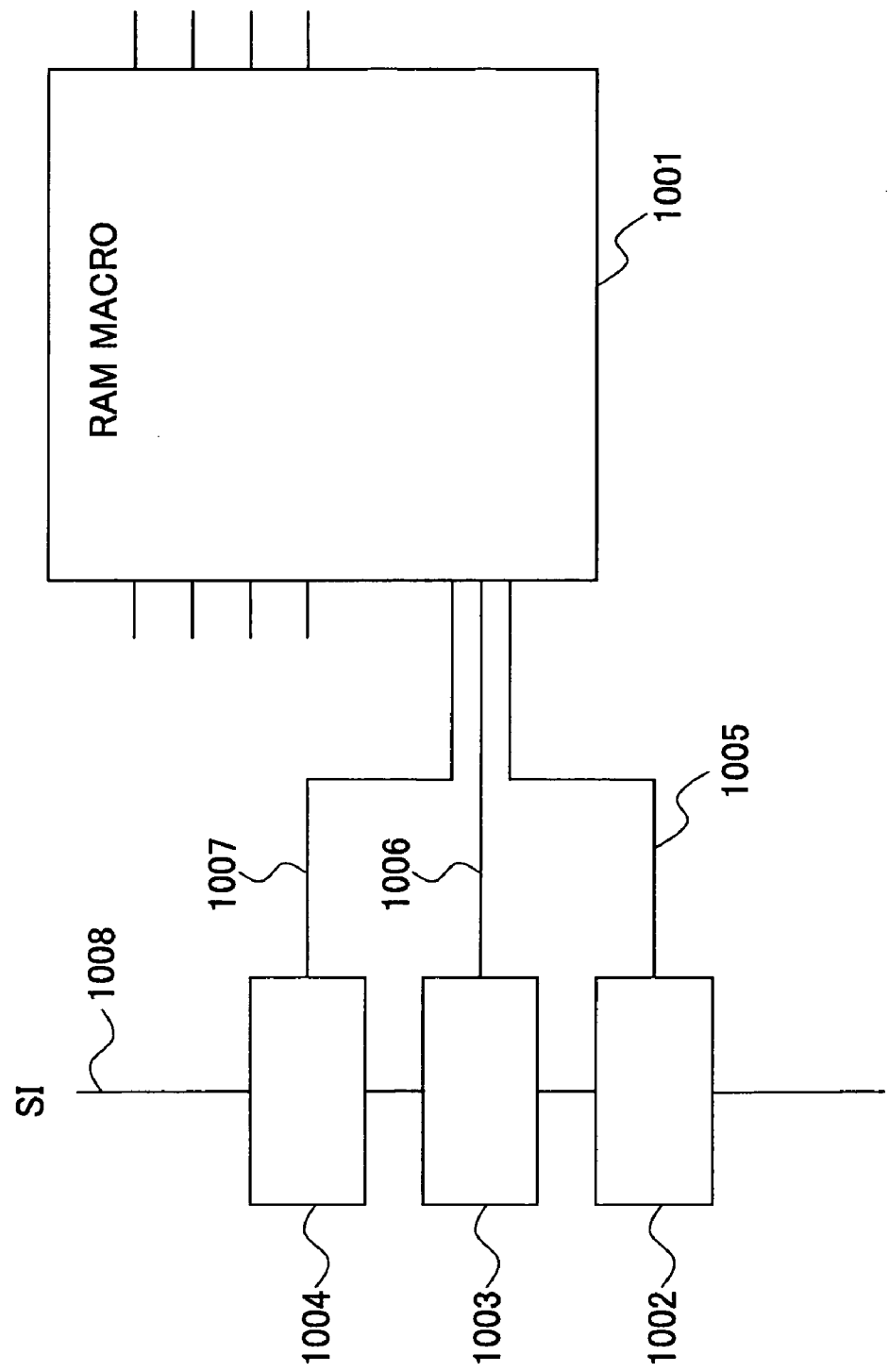
FIG. 10 is a diagram illustrating a third embodiment of the present invention, in which the present invention is used in a circuit for setting a signal for controlling a memory.

FIG. 10 is a diagram for illustrating a third embodiment of the present invention for use in a circuit for setting a signal for controlling a memory. FIG. 10 is an embodiment for storing a 3-bit parameter value for adjusting a sense-amplifier starting-timing. The 3-bit parameter value for adjusting the sense-amplifier starting-timing stored in flip-flops 1002, 1003, and 1004 of the embodiment of the present invention is input via signal lines 1005, 1006, and 1007. Using the parameter value, an error at the time of designing the sense amplifier or a dispersion in manufacturing may be absorbed. Moreover, if the RAM can operate at high speed, the starting timing of the sense amplifier can be set ahead to achieve an improvement in the performance. On the other hand, when the RAM operation is unstable, the starting timing of the sense amplifier can be delayed to maintain an operating margin.

While a flip-flop circuit of the embodiments of the present invention is applied to the flip-flop circuit for storing a parameter value, a SI (Scan-chain Input) 1008 is added separately from a normal data input. The SI 1008 has dedicated control-signals ACK and BCK. The ACK controls ons and offs between the SI 1008 and the master latch while the BCK controls ons and offs between the master and the slave.

The process of: turning off between the master and the slave (BCK=1); then turning on between the SI and the master (ACK=1); then turning off between the SI and the master (ACK=0); and then turning on between the master and the slave (BCK=0); is repeated so as to connect the flip-flop circuits in a chain for propagating the signal sequentially within the chain. Then, each flip-flop can be set with a desired value.

Figure 11:
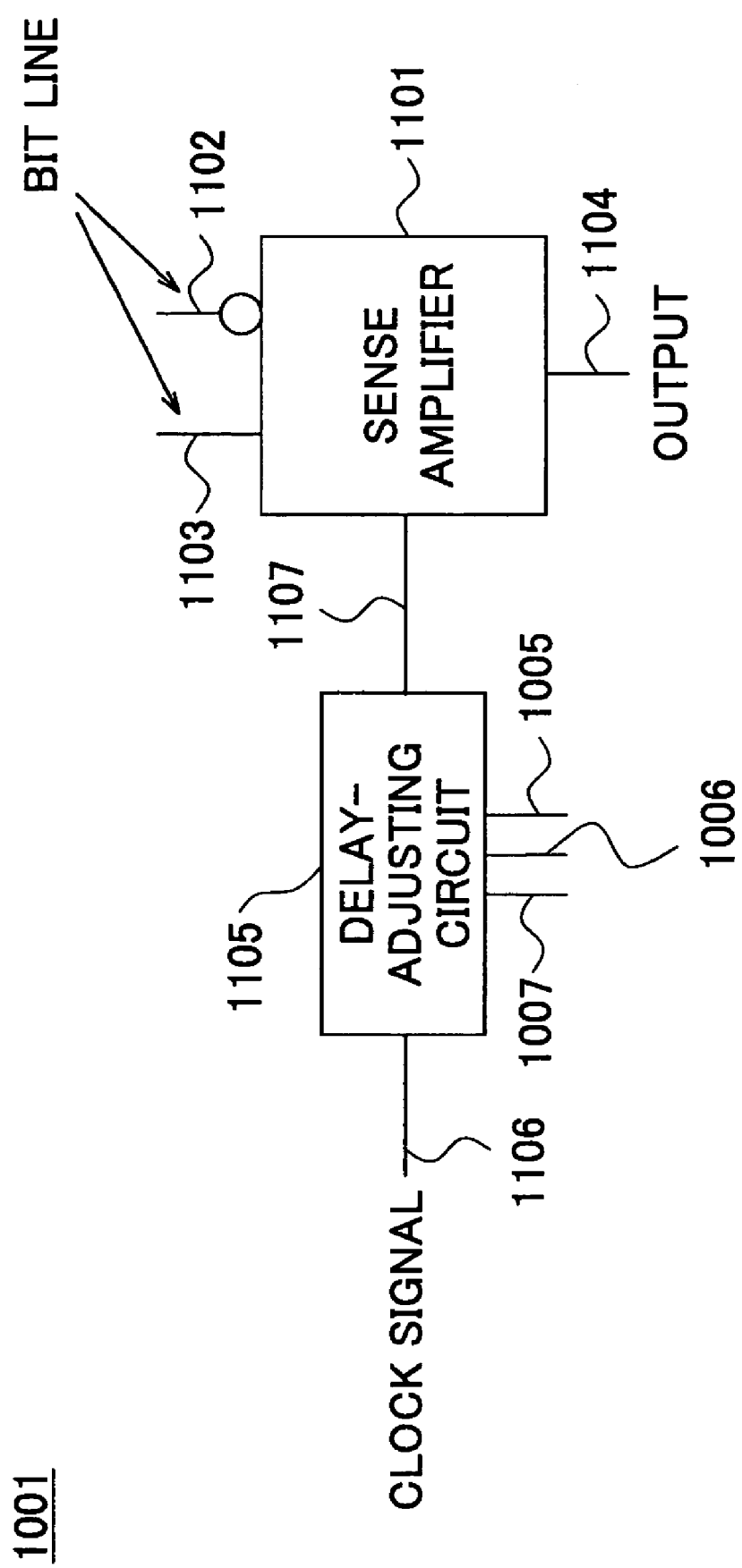
FIG. 11 is a diagram illustrating a sense-amplifier and a delay-adjusting circuit that are within a RAM macro as illustrated in FIG. 10.

FIG. 11 illustrates a sense amplifier 1101 and a delay-adjusting circuit 1105 within the RAM macro as illustrated in FIG. 10. The sense amplifier has bit lines 1102 and 1103, an output 1104, and a terminal for inputting the sense-amplifier starting signal 1107. The delay-adjusting circuit 1105 is connected to the terminal for inputting the sense-amplifier starting signal 1107. The 3-bit parameter value for adjusting the starting timing of the sense-amplifier is input to the delay-adjusting circuit 1105 from the flip-flops 1002, 1003 and 1004 of the embodiment of the present invention as illustrated in FIG. 10 via signal lines 1005, 1006 and 1007.

Figure 12:
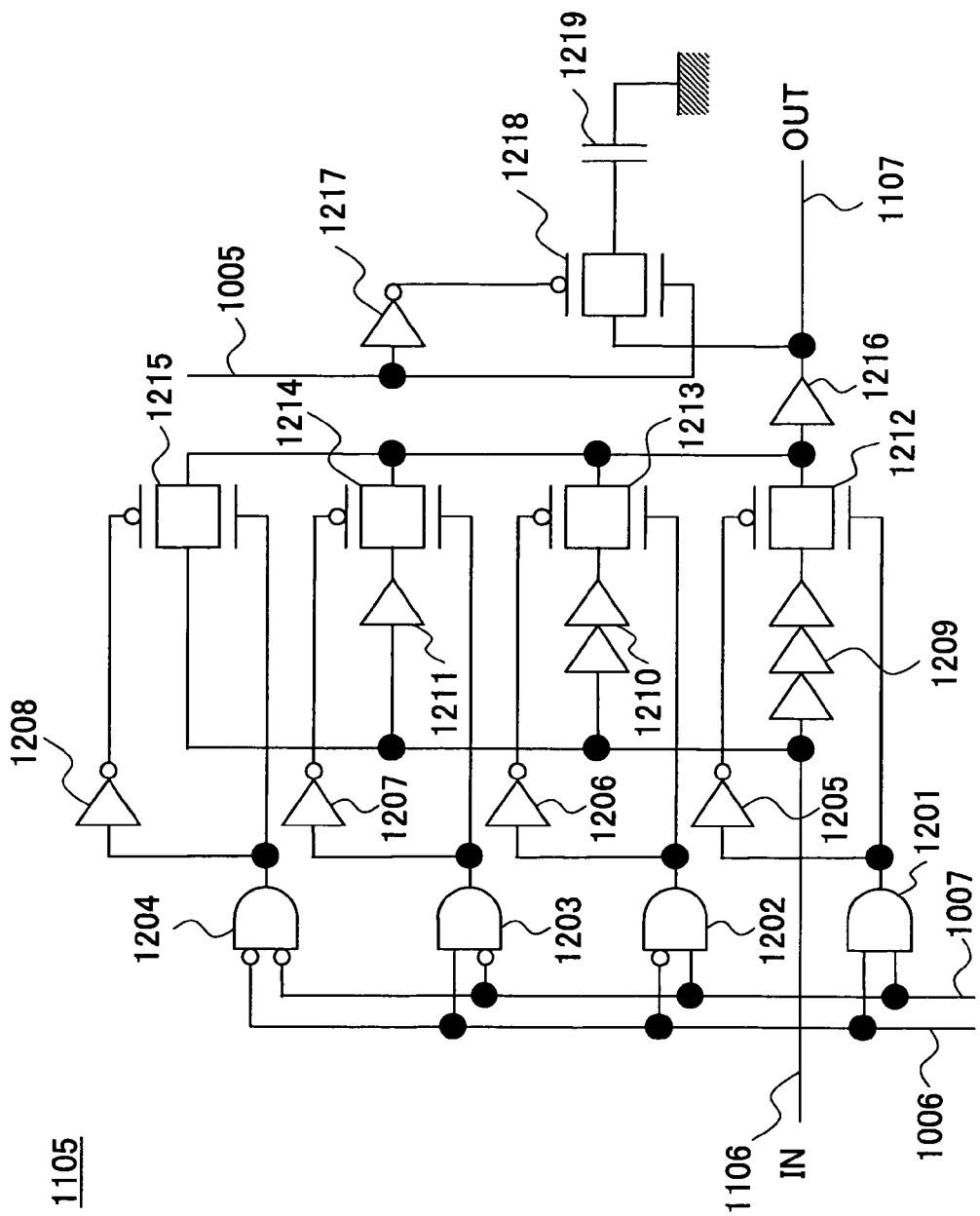
FIG. 12 is a diagram illustrating an embodiment of the delay-adjusting circuit.

FIG. 12 illustrates an embodiment of the delay-adjusting circuit 1105 in FIG. 11. The delay-adjusting circuit 1105 is primarily composed of gate circuits 1201 through 1204, inverters 1205 through 1208, delay buffers 1209 through 1211, transfer gates 1212 through 1215, a buffer 1216, an inverter 1217, a transfer gate 1218, and a capacitor 1219.

The timing-adjusting signal 1005 is applied to inverter 1217 and to the positive input of the transfer gate 1218 so as to control whether to ground an output 1107 via the capacitor 1219.

A clock signal is applied to the delay-adjusting circuit from an input 1106. The applied clock signal is supplied to the delay buffers 1209 through 1211 and to an input of the transfer gate 1215. The clock signals supplied to the inputs of the delay buffers 1209 through 1211 are supplied from the outputs of the delay buffers 1209 through 1211 to the transfer gates 1212 through 1214, respectively.

The timing-control signals 1006 and 1007 are decoded with the gate circuits 1201 through 1204 so that only one transfer gate of the transfer gates 1212 through 1215 outputs the clock signal. Hereby, the input clock signal is output without delay or with a delay amount corresponding to delays of the delay buffers 1209 through 1211. The delayed clock signal as described above is supplied to the sense amplifier 1101 via the buffer 1216.

FIG. 13 illustrates an example of a timing adjustment of the sense-amplifier starting signal.

Item (1) illustrates the clock signal 1106 input to the delay circuit 1102.

Item (2) illustrates a signal variation of a bit-line positive 1103 in FIG. 11.

Item (3) illustrates a signal variation of a bit-line positive 1102 in FIG. 11.

Item (4) illustrates the sense-amplifier starting signal 1107 in FIG. 11.

The delay circuit 1102 adjusts an output timing of the sense-amplifier starting signal as illustrated in (4). For example, when adjusting the output timing of the sense-amplifier starting signal at a timing as represented with (A), the sense amplifier starts at a timing such that signal variations of the bit lines illustrated in (2) and (3) are small. On the other hand, when adjusting the output timing of the sense-amplifier starting signal at a timing as represented with (B), the sense-amplifier starts at a timing such that signal variations of the bit lines illustrated in (2) and (3) have become large.

Adjusting the sense-amplifier starting signal as in (A) leads to a higher operating speed of the RAM so as to improve the performance. On the other hand, adjusting the sense-amplifier starting signal as in (B) results in a lower operating speed of the RAM but in improving the operating margin as the sense amplifier operates at a timing such that there is a large difference in potential between the bit lines.

Thus, the starting timing of the sense amplifier is delayed until there is enough difference in potential between positive-logic and negative-logic bit lines when the sensitivity of the sense amplifier is poor, or the starting timing of the sense amplifier is delayed when some time is needed for driving a bit line in a case such that the driving capability of the RAM cell is low, so as to maintain the operating margin. Moreover, the starting timing of the sense amplifier is set ahead when the driving capability of the RAM circuit is sufficiently high and the circuit is at high speed, so as to make it possible to improve the delay time of the RAM operation for achieving a higher operating speed.

As described above, a flip-flop circuit having a majority-logic circuit may be provided that can output correct storage contents even when a soft error takes place, that can recover from the soft error so as to maintain the correct storage contents, and that has a small circuit size and for which the circuit can be tested easily.

What is claimed is:

1. A flip-flop circuit having a majority-logic circuit, comprising:
  a plurality of master latches writing in corresponding input signals; and
  a slave latch having an input connected to an output of said majority-logic circuit and an output connected to an input of said majority-logic circuit;
  wherein the majority logic-circuit has plural of the inputs connected to respective outputs of said master latches; and
  wherein, during the period in which said master latches do not write in the corresponding input signals, an output signal of said majority-logic circuit is supplied to respective inputs of said master latches.

2. A flip-flop circuit having a majority-logic circuit, comprising:
  a plurality of master latches;
  an input-switching circuit switching said respective master latches; and
  a slave latch;
  wherein an input signal is supplied to one input of said input-switching circuit and an output of said majority-logic circuit is connected to the other input of said input-switching circuit;
  wherein outputs of said input-switching circuit are connected to corresponding inputs of said master latches;
  wherein outputs of said master latches and an output of said slave latch are connected to inputs of said majority-logic circuit;
  wherein the output of said majority-logic circuit is connected to an input of said slave latch;
  wherein said input-switching circuit outputs said input signal when writing the input signal into said master latches and outputs an output signal of said majority-logic circuit when maintaining corresponding values stored in said master latches; and
  wherein said slave latch writes the output signal of said majority-logic circuit when said master latches maintain the values stored into said master latches.

3. A random-access memory, comprising:
  a memory cell;
  a sense amplifier connected to said memory cell;
  a delay-adjusting unit connected to said sense amplifier adjusting a delay of a starting signal of the sense amplifier; and
  a flip-flop circuit having the majority-logic circuit as claimed in claim 1 connected to said delay-adjusting unit storing a delay-parameter value of said delay-adjusting unit.

4. A random-access memory, comprising:
  a memory cell;
  a sense amplifier connected to said memory cell;
  a delay-adjusting unit, connected to said sense amplifier, to adjust a delay of a starting signal of the sense amplifier; and
  a flip-flop circuit having the majority-logic circuit as claimed in claim 2 connected to said delay-adjusting unit storing a delay-parameter value of said delay-adjusting unit.

5. A random-access memory, comprising:
  a memory cell;
  a sense amplifier connected to said memory cell;
  a delay-adjusting unit, connected to said sense amplifier, to adjust a delay of a starting signal of the sense amplifier; and a flip-flop circuit having a majority-logic circuit connected to said delay-adjusting unit to store a delay-parameter value of said delay-adjusting unit,
wherein the flip-flop circuit having the majority-logic circuit includes:
a plurality of input-switching circuits; and
a latch;
wherein an input signal is supplied to respective inputs of said input-switching circuits and an output of said majority-logic circuit is connected to respective other inputs of said input-switching circuits;
wherein respective outputs of said input-switching circuits and an output of said latch are directly connected to inputs of said majority-logic circuit;

wherein the output of said majority-logic circuit is connected to an input of said latch;
wherein said input-switching circuits output said input signal when supplying said input signal to the inputs of said majority-logic circuit and output, when supplying an output signal of said majority-logic circuit to the inputs of said majority-logic circuit, the output signal of said majority-logic circuit; and
wherein said latch, when said input-switching circuits supplying the output of said majority-logic circuit to the inputs of said majority-logic circuit, writes in the output of said majority-logic circuit.

* * * * *